United States Patent [19]

Kansy

[11] Patent Number: 5,293,138
[45] Date of Patent: Mar. 8, 1994

[54] INTEGRATED CIRCUIT ELEMENT, METHODS OF FABRICATION AND UTILIZATION

[75] Inventor: Robert J. Kansy, Champagne, Ill.

[73] Assignee: Electronic Decisions Incorporated, Urbana, Ill.

[21] Appl. No.: 180,775

[22] Filed: Apr. 12, 1988

[51] Int. Cl.⁵ .......................................... H01L 29/00
[52] U.S. Cl. .................................... 333/193; 257/12; 257/20; 257/183.1; 257/215; 257/235
[58] Field of Search .................. 333/166, 193–196; 357/15, 24, 26, 29, 30 D; 257/12, 14, 20, 183.1, 192, 215, 235

[56] References Cited

U.S. PATENT DOCUMENTS

| | | | |
|---|---|---|---|
| 3,519,901 | 7/1970 | Bean et al. | 317/235 |
| 3,691,406 | 9/1972 | Mize | 333/193 X |
| 3,825,995 | 7/1974 | Kurz et al. | 29/571 |
| 3,973,146 | 8/1976 | Arnold et al. | 333/193 X |
| 4,024,480 | 5/1977 | Reeder et al. | 333/166 |
| 4,080,581 | 3/1978 | Sakaue et al. | 333/166 X |
| 4,086,609 | 4/1978 | Foxall et al. | 333/166 X |
| 4,207,545 | 6/1980 | Grudkowski et al. | 333/166 X |
| 4,207,546 | 6/1980 | Grudkowski | 333/166 X |
| 4,247,903 | 1/1981 | Grudkowski et al. | 333/193 X |
| 4,291,286 | 9/1981 | Wagner | 333/166 |
| 4,328,473 | 5/1982 | Montress et al. | 333/166 X |
| 4,633,285 | 12/1986 | Hunsinger et al. | 357/26 |
| 4,636,823 | 1/1987 | Margalit et al. | 357/23.3 |
| 4,642,879 | 2/1987 | Kawata et al. | 29/576 |
| 4,658,279 | 4/1987 | Guckel | 357/26 |
| 4,665,374 | 5/1987 | Fathimulla | 333/166 X |
| 4,698,653 | 10/1987 | Cardwell, Jr. | 357/22 |

OTHER PUBLICATIONS

Y. Umemoto et al, GaAs MESFETS with a Buried P-Layer for Large Scale Integration, 1982, IEEE GaAs IC Symposium pp. 173–176.

H. Zappe et al, Operation of CMOS Devices with a Floating Well, Feb. 1987, vol. ED-34, No. 2, IEEE Transactions on Electron Devices.

*Primary Examiner*—Bernarr E. Gregory
*Attorney, Agent, or Firm*—Joseph W. Berenato, III

[57] ABSTRACT

A circuit element comprises an acoustic charge transport device comprising an input, a barrier element and an output. A transistor assembly comprises a source, a gate and a drain. One of the input, output and barrier elements is operably connected with one of the source, drain and gate.

48 Claims, 5 Drawing Sheets

INTEGRATED CIRCUIT ELEMENT, METHODS OF FABRICATION AND UTILIZATION

GOVERNMENT SUPPORT

This invention was made with government support under contract no. F-30602-84-C-0126 awarded by the Department of Defense. The government may have certain rights in this invention.

BACKGROUND OF THE INVENTION

An acoustic charge transport device ("ACT device") is a semiconductor device utilizing improved surface acoustic wave principles for transporting charge in a buried channel between an input and an output. An exemplary ACT device is disclosed in U.S. Pat. No. 4,633,285, issued to B. Hunsinger, et al for ACOUSTIC CHARGE TRANSPORT DEVICE AND METHOD, the disclosure of which is incorporated herein by reference.

The ACT device is a high performance circuit element which is fabricated on a thick, lightly doped gallium arsenide epitaxial substrate. The ACT device suffers from large insertion loss caused by high terminal impedance which complicates the difficulty of integrating ACT devices with other signal processing components.

A field-effect transistor ("FET") is a circuit component in which the resistance of the current path between the source and the drain is modulated by applying a transverse electric field through utilization of a gate. A metal semiconductor field-effect transistor ("MESFET") is normally fabricated through ion implantation of a p-type layer having doping density and layer thickness between the thin, highly doped n-type implanted layer used for the active MESFET channel, and the thick, lightly doped n-type epitaxial layer used for charge transport in an ACT device.

As noted, the ACT device and MESFET device are customarily fabricated with differing channel thicknesses and doping densities, and integration of them into a usable circuit element therefore presents a number of complicating factors.

The disclosed invention is a circuit element comprised of an ACT device which is operably connected with a MESFET device in a manner which overcomes the high insertion loss of the ACT device, thereby permitting additional signal processing components to be configured that extend the application areas for ACT device technology. MESFET performance is improved by the design of the invention and may be integrated directly onto the thick epitaxial layer. The incorporation of a p-type well implant provides improved MESFET reproducibility, particularly when compared to conventional MESFET devices fabricated through ion implantation into semi-insulating substrates.

OBJECTS AND SUMMARY OF THE INVENTION

The primary object of the disclosed invention is a circuit element, method of fabrication and utilization which permits an ACT device and a MESFET to be integrated onto a common GaAs substrate.

A circuit element according to the invention comprises an acoustic charge transport device comprising input means, output means and barrier means. A transistor assembly comprising source means, drain means and gate means is also provided. Means operably interconnect one of the input, output and barrier means with one of the source, drain and gate means in order to permit a signal to be generated or modulated.

An integrated circuit element according to the invention comprises a semiconductor substrate. An acoustic charge transport device is integral with the substrate and comprises a longitudinally extending buried channel bounded by a barrier element which is disposed at the surface of the substrate, and further comprises input means at one end of the channel and an output at the other end thereof. A field effect transistor is integral with the substrate and comprises source, gate and drain means. Means operably interconnect one of the input means, barrier element and output with one of the source, gate and drain means.

The method of regulating a signal pursuant to the invention comprises the steps of providing an acoustic charge transport device comprising a buried channel overlayed with a barrier element, there being an input means at one end thereof and an output means at the other end thereof. A field-effect transistor is provided and comprises source, gate and drain means. One of the input means, output means and barrier element is interconnected with one of the source, gate and drain means. A first signal is input to one of the acoustic charge transport device and the field-effect transistor to thereby operably effect the interconnected one of the input means, barrier element, output means, source means, gate means and drain means of the other one of the acoustic charge transport device and the field effect transistor so that a second signal propogating through the other one of the acoustic charge transport device and the field-effect transistor is regulated or generated.

A circuit element is fabricated by providing a semiconductor substrate. A channel stop is defined by doping within a first portion of the substrate. Source, channel and drain regions are defined within the channel stop by doping. The source, channel and drain regions are doped with ions having a polarity opposite to the polarity of the ions doping the channel stop and the source and drain regions have substantially identical doping concentration and thickness which differ from the doping concentration and thickness of the channel region. A first contact is formed on the channel stop, a second contact is formed on the source region, a gate contact is formed on the channel region and a drain contact is formed on the drain region. A buried channel is defined within a second portion of the substrate. Transducer means, input and output contacts and a barrier element are formed on the substrate in operative position relative to the channel. One of the transducer means, input and output contacts and barrier element is interconnected with one of the first, second, gate and drain contacts.

These and other objects and advantages of the invention will be readily apparent in view of the following description and drawings of the above described invention.

DESCRIPTION OF THE DRAWINGS

The above and other objects and advantages and novel features of the present invention will become apparent from the following detailed description of the preferred embodiment of the invention illustrated in the accompanying drawings, wherein.

DESCRIPTION OF THE INVENTION

Figure 1:
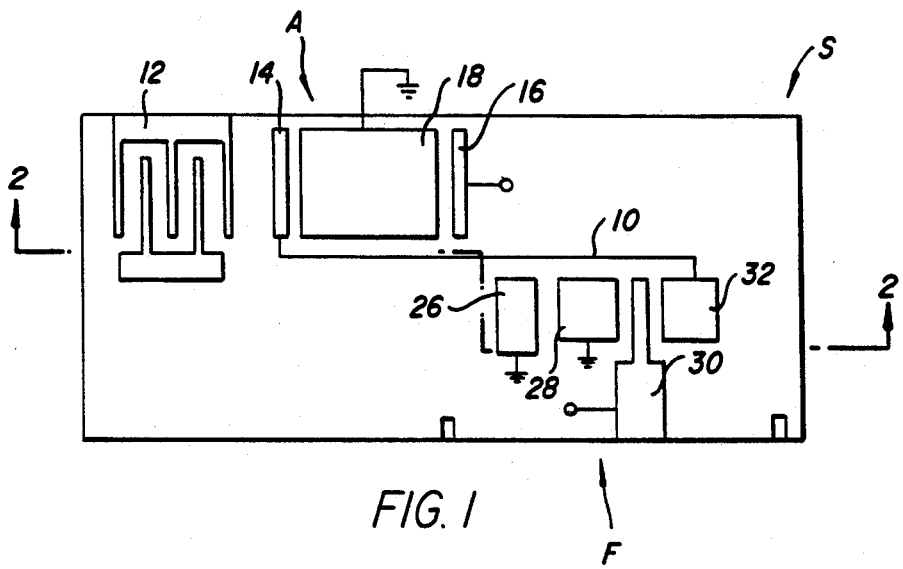
FIG. 1 is a top plan view of a first circuit element pursuant to the invention.

Acoustic charge transport device A is interconnected with metal semiconductor field-effect transistor F through conductive pathway 10, as best shown in FIG. 1. The ACT device A and MESFET F are integrated into semiconductor substrate S by means to be explained.

Figure 2:
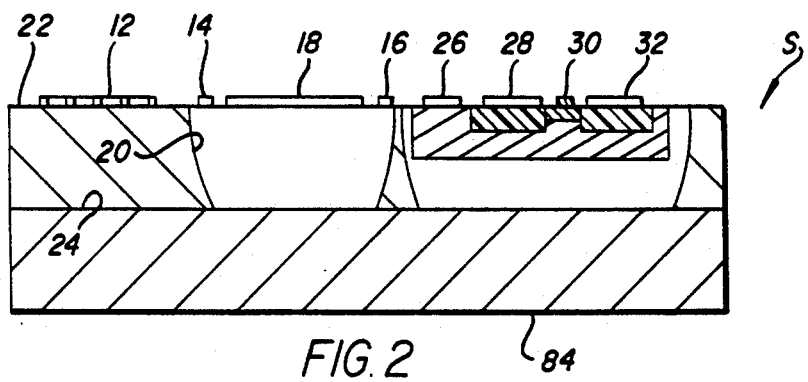
FIG. 2 is a cross-section view taken along the line 2—2 of FIG. 1.

ACT device A comprises a surface acoustic wave transducer 12, input and output contacts 14 and 16, respectively, which are disposed at opposite ends of Schottky barrier element 18. As best shown in FIG. 2, transport channel 20 extends between input and output contacts 14 and 16 and substantially from the surface 22 of substrate S to boundary layer 24. The transport channel 20 is, preferably, bounded through the high energy bombardment of relevant portions of substrate S, and charge is transported from input contact 14 to output contact 16 by the acoustic wave generated by transducer 12 and propagating through channel 20.

MESFET F, as best shown in FIG. 1, comprises an ohmic contact 26, a source 28, a gate 30, and a drain 32. The MESFET F is also integrated into substrate S by the process to be explained.

Figure 3:
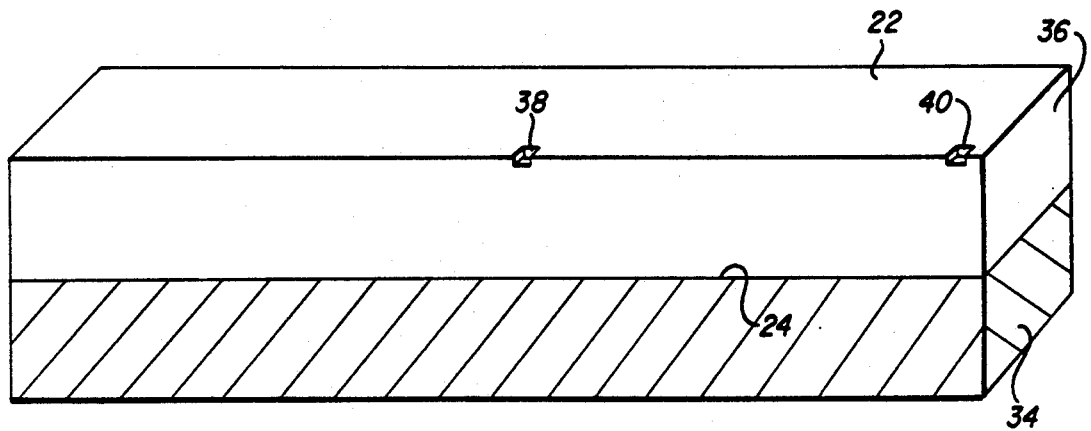
FIG. 3 is a perspective view of a substrate used for fabricating a circuit element pursuant to the invention and disclosing the first step in fabrication process.

Substrate S, as best shown in FIG. 3, includes a semi-insulating GaAs substrate 34 which is overlayed with an n-type GaAs epitaxial layer 36. The thickness and doping density of the epitaxial layer 36 depend upon the desired operating frequency and performance characteristics of the ACT device A. Typical epitaxial layer 36 parameters for ACT devices operating at 360 MHz are a doping density of $10^{15}$ cm$^{-3}$ and a layer thickness of about 3 μm.

The epitaxial layer 36 must first be marked in order to provide an alignment system for use during the fabrication of the MESFET device F. This may be accomplished by photolithographically engraving registration marks or fiducials 38 and 40 into the surface 22 of epitaxial layer 36. The fiducials 38 and 40 are only required for fabrication of the MESFET F, because ion implantation that will be used to form the various channel layers leaves no permanent marks on the semiconductor surface 22 to permit the further photolithographic processes to be accurately aligned.

Figure 4:
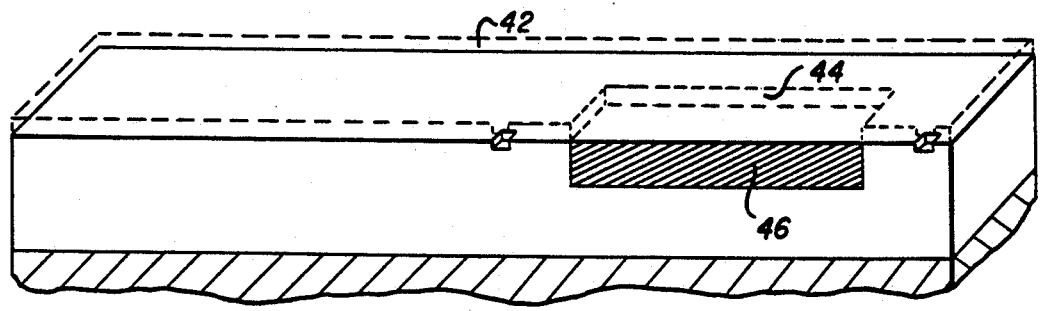
FIG. 4 is a perspective view, partially in section, illustrating the results of a second step of the fabrication process.

The substrate 36, as best shown in FIG. 4, is then coated with an ion implant mask 42, such as of photoresist, in which an opening 44 has been made utilizing photolithographic techniques. Naturally, the opening 44 is aligned with fiducials 38 and 40. P-type species, such as Be or Mg, are caused to penetrate the substrate 36 through the opening 44 and define channel stop or p-type region 46. The ion implantation is accomplished using standard techniques in order to create the p-type region 46. During the production of the p-type region 46, the remaining portion of the surface 22 is completely covered by the mask 42 in order to prevent unintended penetration of substrate 36. Naturally, once the p-type region 46 has been appropriately defined, then the implant mask 42 is stripped off.

Figure 5:
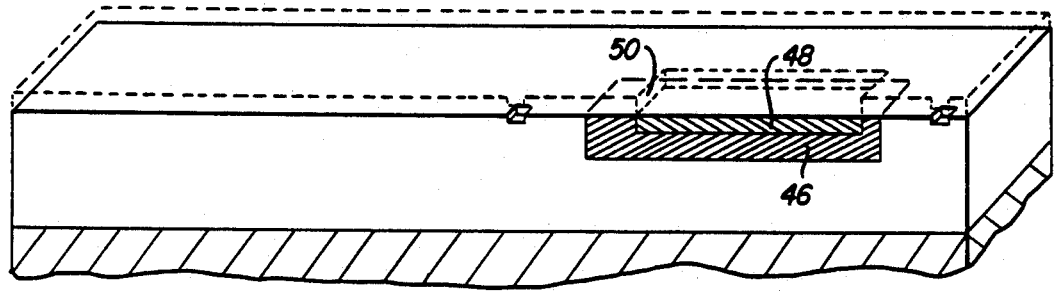
FIG. 5 is a view similar to that of FIG. 4 illustrating the results of a third step of the fabrication process.

FIG. 5 discloses the next step in the fabrication process in which n-type channel region 48 is defined within the p-type region 46. Once again, surface 22 is covered with a suitable mask which has an appropriately dimensioned and positioned. Opening 50 which, as best shown in FIG. 5, is smaller than the opening 44 used to define the p-type region 46. The n-type channel region 48 is fabricated through ion implantation of an n-type impurity, such as Si.

Figure 6:
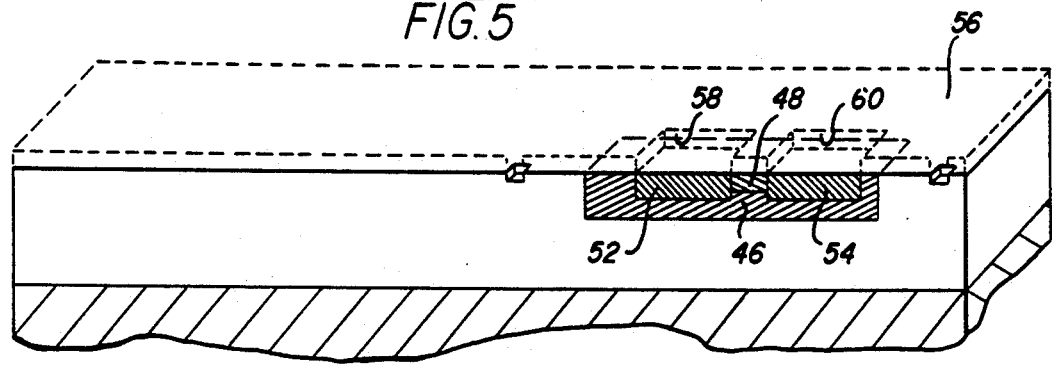
FIG. 6 is yet another view illustrating the results of a fourth step of the fabrication process.

N-type source and drain regions 52 and 54, respectively, are then defined in p-type region 46 and in relevant portions of the n-type region 48, as best shown in FIG. 6. Once again, an implant mask 56 overlies the surface 22 and has appropriately aligned and dimensioned openings 58 and 60 corresponding with the source and drain regions 52 and 54, respectively.

The implant mask material 56 covers that portion of the n-type region 48 disposed between the source and drain regions 52 and 54, respectively, in order to maintain the integrity of that portion of channel region 48. The source and drain regions 52 and 54 are more highly doped than is the channel region 48 in order to reduce parasitic source and drain resistance, and as a means for improving device performance. Preferably, the source and drain regions 52 and 54 have identical doping concentration and thickness.

After the mask 56 is stripped, then the surface 22 is covered with a thin layer of a silicon compound, such as $Si_3N_4$ or $SiO_2$, in order to protect the surface. The substrate S is then annealed through a heat treatment process to activate the implanted species. The heat treatment must be controlled very precisely in order to prevent deterioration of the epitaxial layer 36. This annealing may be accomplished through rapid thermal annealing techniques in order to heat the substrate to approximately 750° C. for between 2 to about 5 seconds.

Figure 7:
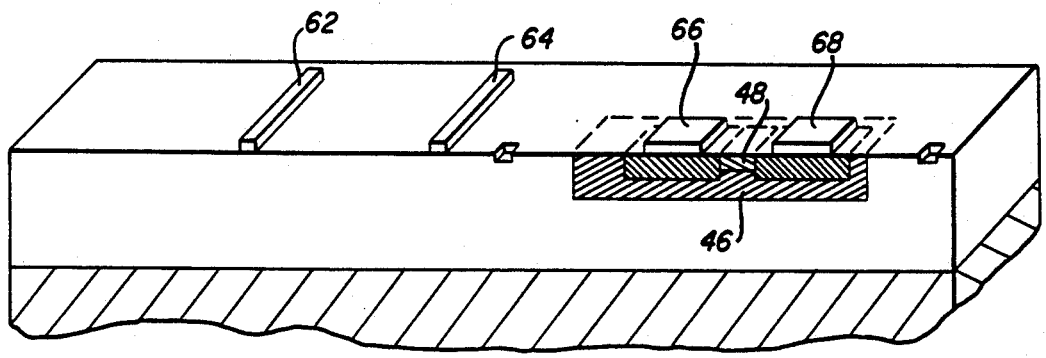
FIG. 7 is a further view illustrating the results of a fifth step of the fabrication process.
Figure 8:
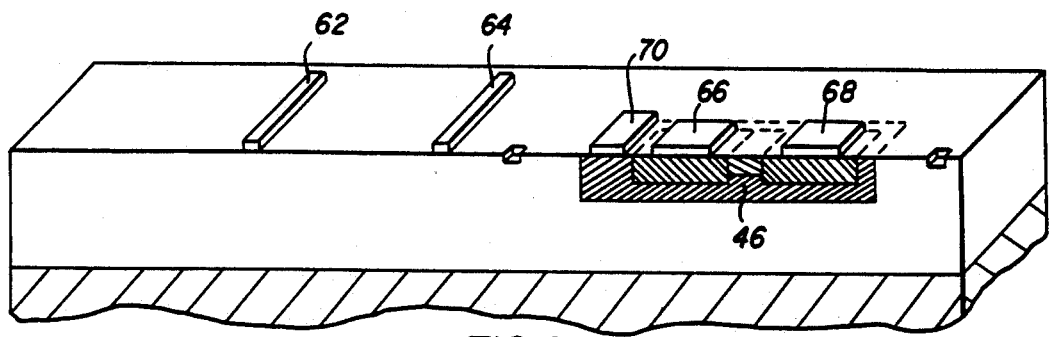
FIG. 8 is a further view illustrating the results of a sixth step of the fabrication process.
Figure 9:
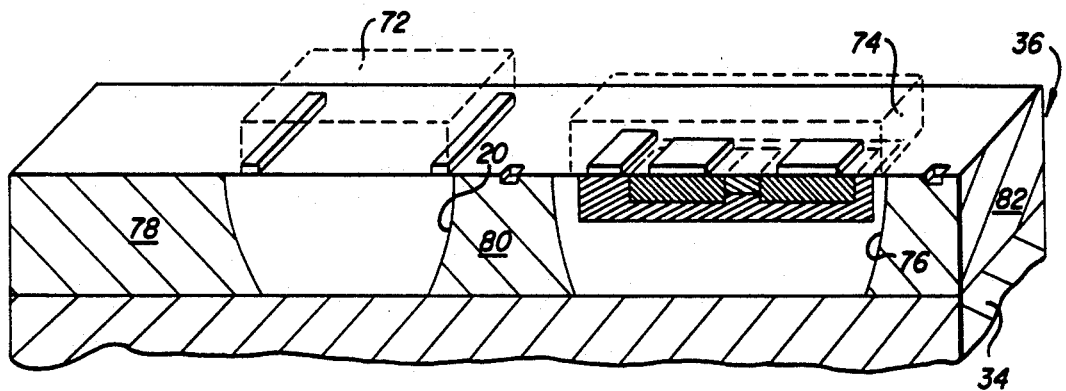
FIG. 9 is a further view illustrating the results of a seventh step of the fabrication process.

After the silicon compound layer has been removed from the surface 22, then photolithographic techniques are used to pattern ohmic contacts 62 and 64, which correspond to the input and output contacts 14 and 16, respectively, on surface 22, as best shown in FIG. 7. Similarly, source and drain contacts 66 and 68 are patterned onto source and drain regions 52 and 54, respectively. The source and drain contacts 66 and 68 correspond to the source and drain 28 and 32, respectively, of FIG. 1. Although contacts 62 and 64 are illustrated as being aligned with contacts 66 and 68, I have found that best results are achieved when the ACT device A is laterally spaced from MESFET F. This prevents the acoustic wave from interfering with operation of the MESFET. FIGS. 7 through 9 are merely illustrative and the actual components would be spaced apart, such as is illustrated in FIG. 1.

Ohmic contact 70 is next patterned onto surface 22 in intimate contact with p-type region 46, as best shown in FIG. 8. The ohmic contact 70 is, preferably, comprised of a metal which is different from the metal which is used to fabricate the contacts 62, 64, 66 and 68.

After the contacts have been fabricated onto the surface 22 of the epitaxial layer 36, then appropriate portions of the surface 22 are coated with an ion implant masking material, as best shown in FIG. 9. The masks 72 and 74 define islands which are aligned with the ohmic contacts in order to prevent the penetration of high energy protons used to electrically isolate the transport channel 20 from the MESFET channel 76. Also, as those skilled in the art will appreciate, multiple MESFET devices F could be incorporated into the substrate 36 so that the proton bombardment can also be used to electrically isolate adjacent MESFET devices F. The proton bombarded portons of the substrate 36 are identified by 78, 80 and 82 in FIG. 9. After the proton bombardment has been completed, then the surface 22 is coated with a metal layer which is patterned by photolithographic techniques to form the SAW transducer 12, the Shottky barrier element 18, the gate 30 and the conductive pathway 10.

The p-type layer 46 preferably has a doping density of about $10^{16}$ cm$^{-3}$ and a thickness of about 1 μm. The n-type MESFET channel 48 has a doping density of about $10^{17}$ cm$^{-3}$ and a thickness of about 0.25 μm.

The source 28, ohmic contact 26, gate 30 are grounded in operation, as is the back gate terminal 84, as best shown in FIG. 2. A small positive bias voltage is applied to drain 32.

An equilibrium depletion layer extends into the epitaxial layer 36 from the epitaxial layer/semi-insulating substrate interface 24 due to donor-like defects existing at this interface. Similarly, an equilibrium depletion region exists about the p-type epitaxial layer 76 and the channel stop 46. A depletion layer exists at the surface of the channel 48 directly beneath the gate 30 due to the Shottky barrier.

A current path exists in the undepleted MESFET channel 48 between the source 28 and the drain 32, resulting in measurable current flow. Variations in the bias voltage applied to gate 30 affects channel region 48, thereby modulating the resistance of the conducting channel 48 and hence the channel current.

An important feature of the invention is that the undepleted p-type region 46 between the channel 48 and the channel 76 screens the channel 48 from variations in the bias voltage applied to the back gate contact 84. In normal operation of an ACT device, such as the device A of FIG. 1, the back gate bias voltage must be adjusted to cause the ACT transport depth to be optimized within channel 20. The location of the edge of the back gate depletion layer can vary substantially, depending upon the architecture of the device employed. Because of the p-type isolation layer 46, these variations will not affect the MESFET device F, as long a the p-type layer 46 is not fully depleted. This places constraints on the p-type layer 46 doping density and thicknesses that depend primarily on the properties of the MESFET channel layer 48.

Those skilled in the art will understand that the invention incorporates a thin, highly doped n-type MESFET channel layer 48 surrounded by a thicker, more lightly doped p-type isolation layer 46 which is not completely depleted under normal operating conditions. Both layers 46 and 48 are fabricated in a thick, lightly doped n-type epitaxial layer 36 which is grown on a semi-insulating substrate 34. The p-type layer 46 isolates the MESFET channel 48, and thereby optimizes operation of the MESFET channel 48.

Figure 12:
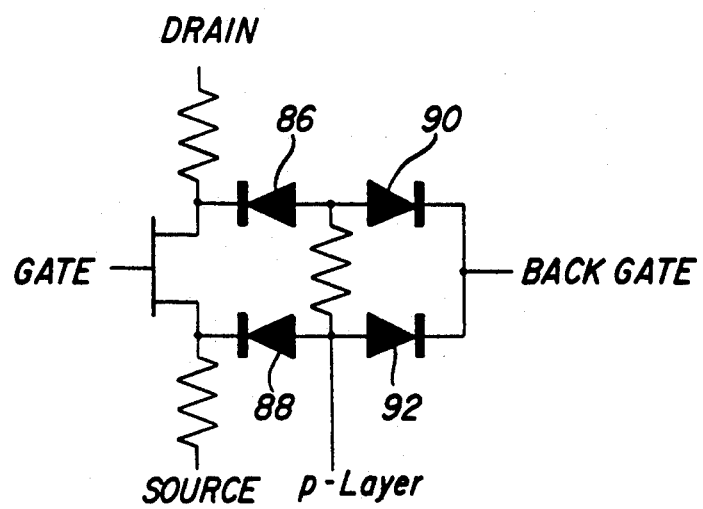
FIG. 12 is a schematic view illustrating an equivalent circuit pursuant to the invention.

The equivalent circuit of the interconnected ACT device A and MESFET F of FIG. 1 is shown in FIG. 12. The p-type region 46 is modeled as a pair of diodes 86 and 88 connected to the drain and source, respectively, of the MESFET F. The anodes of the diodes 86 and 88 are connected by a resistor representing the sheet resistance of the undepleted p-type layer 46. The p-type layer 46 to epitaxial layer 36 junction is modeled by the remaining diode pair 90 and 92. In order to ensure that all diodes are reverse biased, it is necessary that the bias applied to the p-type layer 46 be more negative than any of the other terminal voltages. However, if the epitaxial layer 36 is isolated from other transport regions, such as through using proton isolation, then it is sufficient to connect the p-type layer 46 to the source 28.

The embodiment of FIG. 1 operates as an input amplifier. A first signal is input to the gate 30 in order to cause modulation of a second signal propagating through the MESFET F. The output of drain 32 is connected to the input contact 14 of the ACT device A. The signal from the output contact 16 may thereby be operably connected with a power supply or the like. In this embodiment, the combination of the devices A and F operates as an amplifier, for which no resistor is needed. The ACT device A acts as a load.

Figure 10:
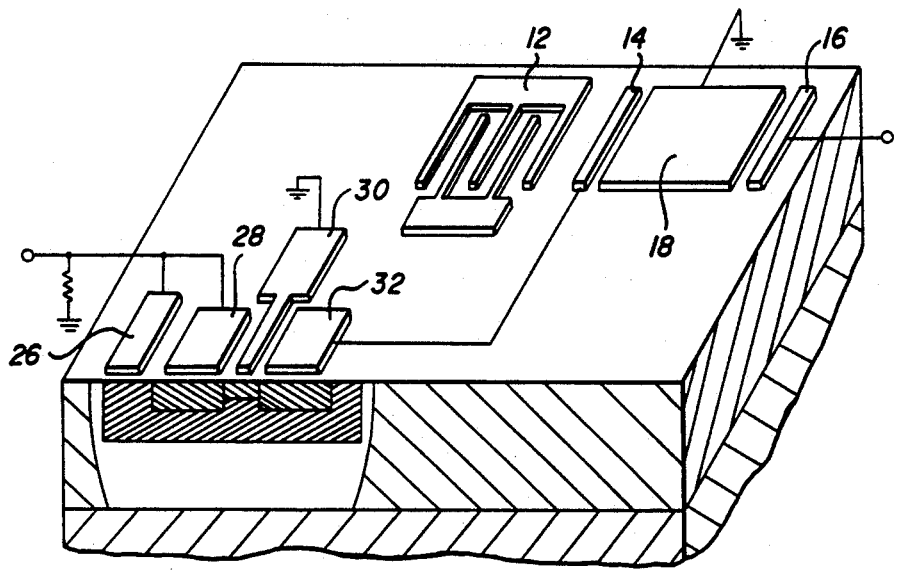
FIG. 10 is a perspective view, partially in section and schematic, illustrating a circuit element similar to that of FIG. 1.

The embodiment of FIG. 10 is similar to that of FIG. 1 except that the first signal is applied through the source 28, rather than through the gate 30. This embodiment has the advantage of lower input impedance.

Figure 11:
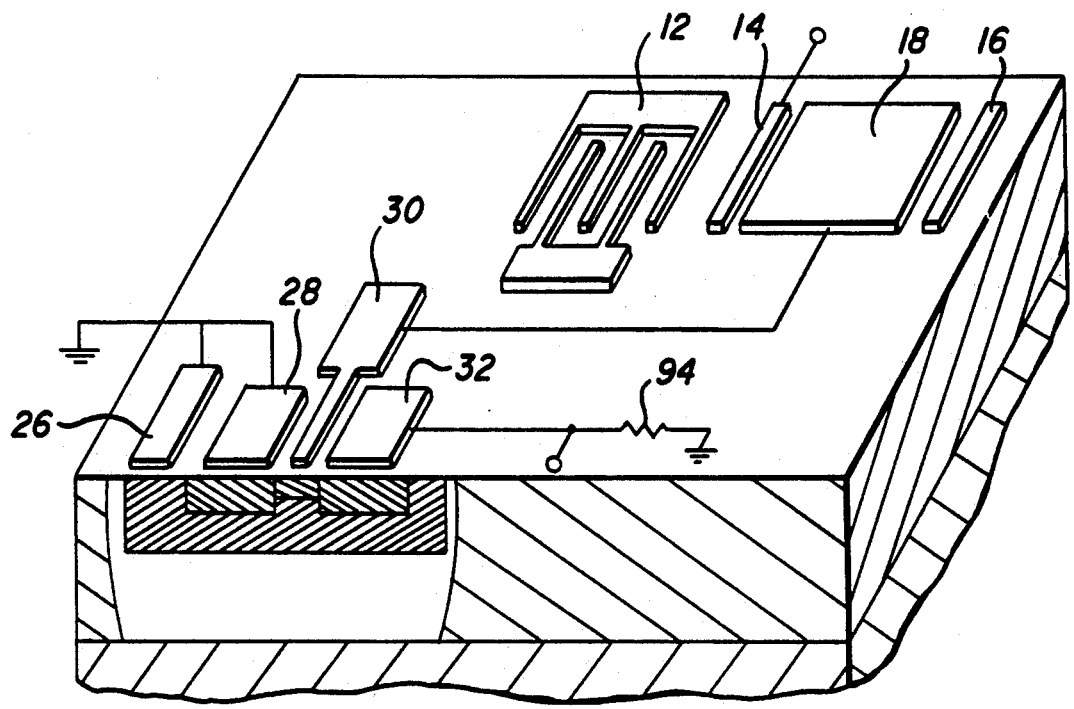
FIG. 11 is a perspective view, partially in section and schematic, illustrating an output amplifier pursuant to the invention.

The embodiment of FIG. 11 is a non-destructive sense output amplifier through the interconnection of the gate 30 with the Shottky barrier element 18. In this regard, the high input impedance of the MESFET F provides a better match to the non-destructive sense barrier element 18. This embodiment therefore operates as a buffer amplifier. The drain 32 is connected to the positive terminal of a power supply. It is possible to monitor current by looking at the voltage across the resistor 94.

Figure 13:
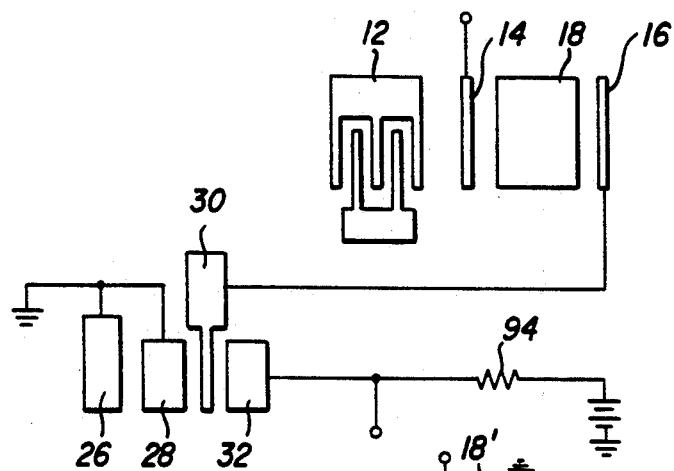
FIG. 13 is a top plan view illustrating an output amplifier pursuant to the invention.

The embodiment of FIG. 13 operates as a destructive sense amplifier because of the interconnection of the output contact 16 with the gate 30.

Figure 14:
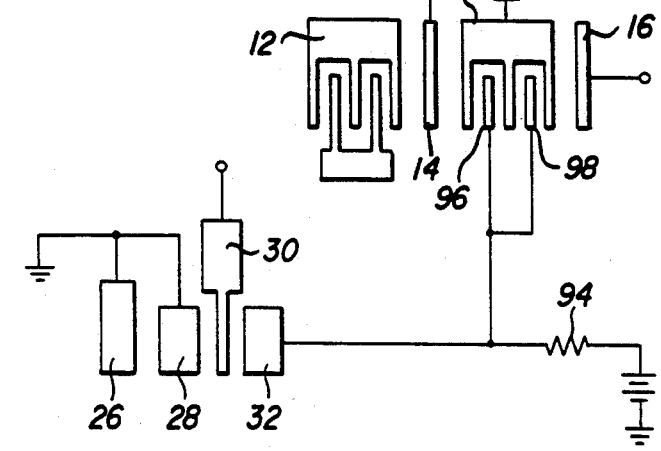
FIG. 14 is a top plan view illustrating a barrier gate control amplifier pursuant to the invention.

The embodiment of FIG. 14 operates as a barrier element gate control amplifier. It is possible to "freeze" or suspend in position the charge being transported by the wave generated by the transducer 12, providing that proper voltage conditions exist at the barrier element overlying the transport channel. It can be noted in FIG. 14 that the barrier element includes fingers 96 and 98 which are remote from the fingers of the barrier element 18' and which are operably connected to the drain 32. The fingers 96 and 98 are comprised of a Shottky barrier material and thereby serve basically the same function as does the barrier element 18'. Application of a voltage to the fingers 96 and 98, however, causes the charge traveling with the wave to be suspended in position, so that the fingers 96 and 98 thereby operate much as a valve, depending upon the voltage condition which exists.

Figure 15:
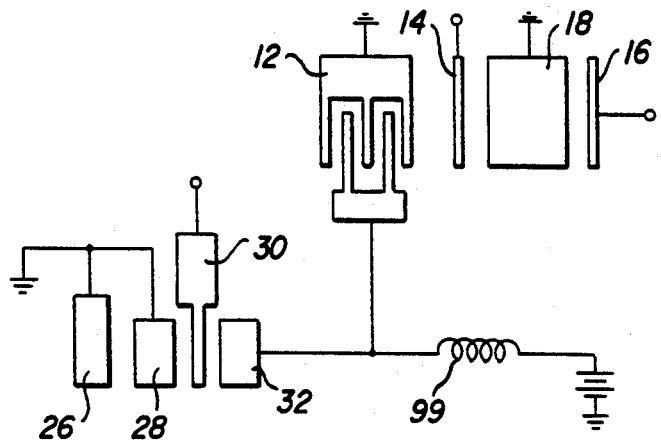
FIG. 15 is a top plan view illustrating an amplifier for driving the transducer of the invention.

The FIG. 15 embodiment is one wherein the output of the MESFET F is used to provide the driving power for the transducer 12. In this regard, the drain 32 is operably connected with one of the combs of the transducer 12 in order to provide the high level drive signal necessary for generating the surface acoustic wave which is used to transport the charge along the ACT transport channel 20. Preferably, a inductor 99 is operably connected with drain 32 in order to resonate with the transducer 12 capacitance.

Figure 16:
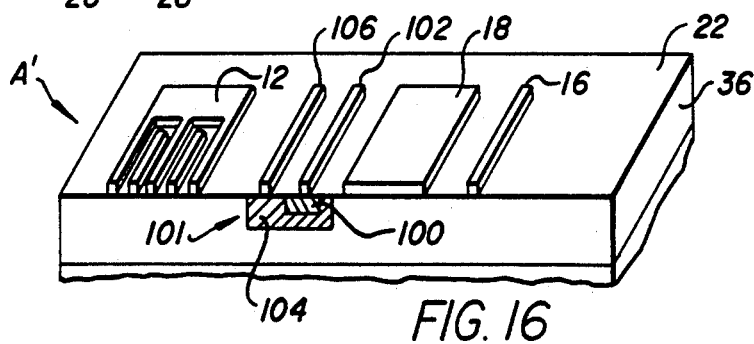
FIG. 16 is a perspective view, partially in section, illustrating a vertical bipolar transistor amplifier integrated with the ACT device input structure; and, FIG. 17 is a schematic view illustrating an equivalent circuit of the embodiment of FIG. 16.
Figure 17:
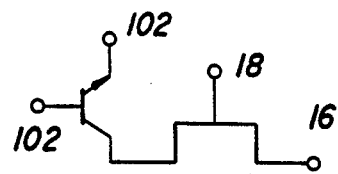

FIG. 16 discloses an embodiment wherein the ACT device A' incorporates a vertical npn bipolar transistor 101 as the input structure. An n-type implant 100 is overlayed with an n-type ohmic contact 102 which is spaced from the barrier element 18. A p-type implant 104 extends into the substrate 36 and around the n-type implant 100 and is overlayed with a p-type ohmic contact 106. The resulting structure is a vertical npn bipolar transistor 101 which improves the input circuit transconductance. The contacts 102 and 106, with their implant layers 100 and 104, respectively, thereby provide the equivalent of the input structure 14 of FIG. 1. A model of the ACT device A' of FIG. 16 is given in FIG. 17.

Those skilled in the art will understand that the disclosed invention is one permitting regulation of the signal being transported along the ACT transport channel 20, one which serves to modulate the signal being transported through the MESFET channel F, or one which generates the acoustic wave used to transport the charge in the ACT A. The disclosed invention can therefore be configured into any one of a number of signal processing elements which may be incorporated into various electronic systems. The invention is a monolithic circuit element which minimizes parasitic capacitance in a manner which optimizes the geometry of the MESFET in order to better match the parameters of the ACT device A. Preferably, the ACT device A and the MESFET device F are laterally spaced apart in order to prevent the high power acoustic wave generated by the transducer 12 from interfering with the operation of the MESFET F.

The channel stop 46 prevents the channel 48 current from flowing deep into the epitaxial layer 36, and also minimizes or eliminates any effects on the MESFET F as could be caused by the back gate bias applied to the semi-insulating substrate 34. The p-type layer 46 permits good surface transport for high transconductance, provides a vertical channel stop for good pinch-off performance, and, as mentioned, shields the MESFET channel 48 from variations in the back gate bias applied to the substrate 34.

While this invention has been described as having a preferred design, it is understood that it is capable of further modifications, uses and/or adaptations of the invention following in general the principle of the invention and including such departures from the present disclosure as come within known or customary practice in the art to which the invention pertains, and as may be applied to the central features hereinbefore set forth, and fall within the scope of the invention of the limits of the appended claims.

What I claim is:

1. A circuit element, comprising:
    a) an acoustic charge transport device comprising a buried channel formed in a piezoelectric semiconductor substrate including input means at one end of said channel, barrier means overlaid on said channel, output means at an end of said channel opposite to said input means end, and transducer means proximate said input means for propagating an acoustic wave through said channel for transporting charge between said input means and said output means;
    b) a transistor assembly comprising source means, gate means and drain means; and,
    c) means operably interconnecting one of said input, output and barrier means with one of said source, drain and gate means.

2. The circuit element of claim 1, wherein:
    a) said input means is operably connected to said drain means.

3. The circuit element of claim 1, wherein:
    a) said barrier means is operably connected to said gate means.

4. The circuit element of claim 1, wherein:
    a) said output means is operably connected to said gate means.

5. The circuit element of claim 1, wherein:
    a) said barrier means is operably connected to said drain means.

6. The circuit element of claim 1, wherein:
    a) said input means includes a transducer means; and,
    b) said drain means is operably connected to said transducer means.

7. The circuit element of claim 1, wherein:
    a) said input means includes a bipolar transistor.

8. The circuit element of claim 1, wherein:
    a) said acoustic charge transport device and said transistor assembly are integrated onto a common semiconductor substrate.

9. The circuit element of claim 8, wherein:
    a) each of said input, output, barrier, source, drain and gate means includes a metallic layer formed on a surface of said substrate.

10. The circuit element of claim 9, wherein:
    a) said source means includes first and second sequentially spaced contacts, said first contact is in intimate contact with a first portion of said substrate which has been treated to have a first polarity and said second contact is in intimate contact with another portion of said substrate which has been treated to have a second polarity.

11. The circuit element of claim 10, wherein:
    a) said first portion is in intimate contact with said second portion and extends below said second portion and beyond said drain means.

12. The circuit element of claim 10, wherein:
    a) said drain means metallic layer is in intimate contact with a third portion of said substrate which has been treated so as to have a polarity substantially the same as said second portion.

13. The circuit element of claim 12, wherein:
    a) said second and third portions are separated by a fourth portion underlying said gate, said fourth portion having been treated to have a polarity substantially the same as said second and third portions but of a lesser intensity.

14. The circuit element of claim 8, wherein:
a) said input, output and barrier means are disposed along a first axis;
b) said source, drain and gate means are disposed along a second axis; and,
c) said axes are laterally spaced apart.

15. The circuit element of claim 8, wherein:
a) portions of said substrate have been treated for isolating said acoustic charge transport device from said transistor assembly.

16. The circuit element of claim 8, wherein:
a) selected portions of said substrate have been exposed to bombardment by high energy ions for isolating said acoustic charge transport device from said transistor assembly.

17. The circuit element of claim 1, wherein:
a) said source means includes first and second metal contacts, said contacts are sequentially arranged and said second contact is disposed proximate said gate.

18. The circuit element of claim 17, wherein:
a) said contacts are operably interconnected.

19. An integrated circuit element, comprising:
a) a semiconductor substrate;
b) an acoustic charge transport device integral with said substrate and comprising a longitudinally extending buried channel bounded by a barrier element disposed at a surface of said substrate and an input means at one end of said channel and an output means at an opposite end of said channel and an acoustic wave generator for propogating a wave through said channel for transporting charge between said input and output means;
c) a field effect transistor integral with said substrate and comprising source, gate and drain means; and,
d) means operably interconnecting one of said input means, barrier element and output means with one of said source, gate and drain means.

20. The circuit element of claim 19, wherein:
a) said substrate is gallium arsenide; and,
b) said barrier element is comprised of Shottky barrier material.

21. The circuit element of claim 19, wherein:
a) said input means, barrier element and output means are disposed along a first axis; and,
b) said source, gate and drain means are disposed along a second axis parallel to and laterally spaced from said first axis.

22. The circuit element of claim 19, wherein:
a) said input means is operably connected to said drain means.

23. The circuit element of claim 19, wherein:
a) said gate means is operably connected to said barrier.

24. The circuit element of claim 19, wherein:
a) said gate means is operably connected to said output means.

25. The circuit element of claim 19, wherein:
a) said drain means is operably connected to said barrier element.

26. The circuit element of claim 25, wherein:
a) said barrier element includes non-destructive control assemblies and said output is operably connected to said non-destructive control assemblies.

27. The circuit element of claim 19, wherein:
a) said drain means is operably connected to said acoustic wave generator.

28. The circuit element of claim 19, wherein:
a) said input means includes a bipolar transistor.

29. The circuit element of claim 19, wherein:
a) said source includes first and second ohmic contacts, said contacts being sequentially spaced and said second contact is disposed proximate said gate means.

30. The circuit element of claim 29, wherein:
a) said substrate has been treated to form first and second portions of opposite polarity;
b) said first portion underlies and is in intimate contact with said second contact, said gate means and said drain means; and,
c) said second portion is in intimate contact with said second contact and said second portion extends beyond and below said first portion.

31. The circuit element of claim 30, wherein:
a) said substrate has been bombarded with high energy ions so that said acoustic charge transport device is electrically isolated from said field effect transistor.

32. The method of regulating a signal, comprising the steps of:
a) providing an acoustic charge transport device comprising a buried channel overlayed with a barrier element and with an input means at one end thereof and an output means at the other end thereof;
b) providing a field effect transistor comprising source, gate and drain means;
c) interconnecting one of the input means, barrier element and output means with one of the source, gate and drain means; and,
d) inputting a first signal to one of the acoustic charge transport device and the field effect transistor and thereby operatively effecting the interconnected one of the input means, barrier element, output means, source means, gate means and drain means of the other one of the acoustic charge transport device and the field effect transistor so that a second signal propagating through the other one of the acoustic charge transport device and the field-effect transistor is regulated or generated.

33. The method of claim 32, including the steps of:
a) interconnecting the input and drain means; and,
b) inputting the first signal to the source means and thereby generating the second signal which is input to the acoustic charge transport device through the input means.

34. The method of claim 32, including the steps of:
a) interconnecting the barrier element and the gate means; and,
b) inputting the first signal through the input means and thereby controlling operation of the gate means so that the second signal propagating through the field effect transistor is regulated.

35. The method of claim 32, including the steps of:
a) interconnecting the output means and the gate means; and,
b) inputting the first signal through the input means and thereby controlling operation of the gate means so that the second signal propagating through the field effect transistor is regulated.

36. The method of claim 32, including the steps of:
a) providing a barrier element having non-destructive control assemblies;

b) interconnecting the drain means and the non-destructive control assemblies; and, c) inputting the first signal to the source means and thereby controlling operation of the non-destructive control assemblies so that the second signal propagating through the acoustic charge transport device is regulated.

37. The method of claim 32, including the steps of:

a) providing an input means comprising a transducer assembly;

b) interconnecting the drain means and the transducer assembly; and, c) inputting the first signal through the source means and thereby controlling operation of the transducer assembly.

38. The method of fabricating a circuit element, comprising the steps of:

a) providing a semiconductor substrate;

b) defining by doping a channel stop within a first portion of the substrate;

c) defining by doping source, channel and drain regions within the channel stop, the source, channel and drain regions being doped with ions having a polarity opposite to the polarity of the ions doping the channel stop and the source and drain regions having substantially identical doping concentration differing from the doping concentration of the channel region;

d) forming a first contact on the channel stop, a second contact on the source region, a gate contact on the channel region and a drain contact on the drain region;

e) defining a buried transport channel within a second portion of the substrate;

f) forming transducer means, input and output contact and a barrier element on the substrate in operative position to the channel; and, g) interconnecting one of the transducer means, input and output contacts and barrier element with one of the first, second, gate and drain contacts.

39. The method of claim 38, including the steps of:

a) providing gallium arsenide as the substrate; and, b) engraving registration marks in the substrate prior to defining the channel stop.

40. The method of claim 39, including the steps of::

a) defining the channel region with p-type ions; and, b) defining the source, gate and drain regions with n-type ions.

41. The method of claim 40, including the step of:

a) interconnecting the input and drain contacts.

42. The method of claim 40, including the step of:

a) interconnecting the barrier element and the gate contact.

43. The method of claim 40, including the step of:

a) interconnecting the output and gate contacts.

44. The method of claim 40, including the step of:

a) interconnecting the barrier element and drain contacts.

45. The method of claim 44, including the steps of:

a) forming on the substrate a barrier element having non-destructive control elements; and, b) interconnecting the drain contact and the non-destructive control elements.

46. The method of claim 40, including the step of:

a) interconnecting the transducer means and the drain contacts.

47. A circuit element, comprising:

a) an acoustic charge transport device comprising input means, barrier means and output means;

b) a transistor assembly comprising source means, gate means and drain means;

c) means operably interconnecting one of said input, output and barrier means with one of said source, drain and gate means;

d) said acoustic charge transport device and said transistor assembly being integrated onto a common semiconductor substrate; and, e) selected portions of said substrate having been exposed to bombardment by high energy ions for isolating said acoustic charge transport device from said transistor assembly.

48. A circuit element, comprising:

a) an acoustic charge transport device comprising input means, barrier means and output means;

b) a transistor assembly comprising source means, gate means and drain means;

c) means operably interconnecting one of said input, output and barrier means with one of said source, drain and gate means;

d) said acoustic charge transport device and said transistor assembly being integrated onto a common semiconductor substrate;

e) each of said input, output, barrier, source, drain and gate means includes a metallic layer formed on a surface of said substrate; and, f) said source means includes a first and second sequentially spaced contacts, said first contact being in intimate contact with a first portion of said substrate which has been treated to have a first polarity and said second contact is in intimate contact with another portion of said substrate which has been treated to have a second polarity.

* * * * *